United States Patent
Chang et al.

(10) Patent No.: US 7,642,189 B2
(45) Date of Patent: Jan. 5, 2010

(54) SYNERGY EFFECT OF ALLOYING MATERIALS IN INTERCONNECT STRUCTURES

(75) Inventors: Hui-Lin Chang, Hsin-Chu (TW); Yung-Cheng Lu, Taipei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/959,274

(22) Filed: Dec. 18, 2007

(65) Prior Publication Data

US 2009/0152722 A1    Jun. 18, 2009

(51) Int. Cl.
*H01L 21/44* (2006.01)

(52) U.S. Cl. .................. 438/687; 438/700; 438/740; 257/E21.115; 257/E21.27; 257/E21.304; 257/E21.311; 257/E21.505

(58) Field of Classification Search .......... 438/687, 438/688, 740, 700, 682, 680, 679, 637, 513, 438/474
See application file for complete search history.

(56) References Cited

U.S. PATENT DOCUMENTS

| | | | | |
|---|---|---|---|---|
| 6,524,957 | B2 * | 2/2003 | Merchant et al. | 438/687 |
| 6,958,547 | B2 * | 10/2005 | Dubin et al. | 257/774 |
| 7,008,872 | B2 * | 3/2006 | Dubin et al. | 438/678 |
| 2002/0030282 | A1 * | 3/2002 | Merchant et al. | 257/774 |
| 2006/0267201 | A1 * | 11/2006 | Huebler et al. | 257/758 |
| 2007/0077761 | A1 * | 4/2007 | Lehr et al. | 438/687 |
| 2007/0123034 | A1 * | 5/2007 | Schuehrer et al. | 438/628 |
| 2008/0206986 | A1 * | 8/2008 | Preusse et al. | 438/653 |

\* cited by examiner

*Primary Examiner*—David Nhu
(74) *Attorney, Agent, or Firm*—Slater & Matsil, L.L.P.

(57) ABSTRACT

A method of forming an integrated circuit structure, the method includes providing a semiconductor substrate; forming a dielectric layer over the semiconductor substrate; forming an opening in the dielectric layer; forming a seed layer in the opening; forming a copper line on the seed layer, wherein at least one of the seed layer and the copper line includes an alloying material; and forming an etch stop layer on the copper line.

21 Claims, 4 Drawing Sheets

SYNERGY EFFECT OF ALLOYING MATERIALS IN INTERCONNECT STRUCTURES

TECHNICAL FIELD

This invention is related generally to integrated circuits, and more particularly to structures and formation methods of interconnect structures, and even more particularly to the improvement in the reliability of the interconnect structures.

BACKGROUND

A commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is preferred in interconnect structures because of its low resistivity. However, copper suffers from electro-migration (EM) and stress migration (SM) reliability issues as geometries continue to shrink and current densities continue to increase.

FIG. 1 illustrates a cross-sectional view of an intermediate stage in the formation of a conventional interconnect structure. Copper line 4 is formed in low-k dielectric layer 2. Etch stop layer (ESL) 6 is formed on the top surface of copper line 4 and low-k dielectric layer 2.

One of the concerns of the interconnect structure shown in FIG. 1 is its reliability, which may be measured using time dependent dielectric breakdown (TDDB). The TDDB is affected by the electro-migration of copper in the interconnect structure. The electro-migration of copper causes copper atoms to migrate from portions of the interconnect structure to others, and hence causing voids. This not only increases the RC delay of the interconnect structures, but also eventually leads to open circuits. This is particularly true for integrated circuits formed using advanced technologies, for example, 32 nm and below. At such low scales, the poor interface between copper and overlying etch stop layer causes interconnect structures to have poor resistance to electro-migration.

The methods for reducing electro-migration were previously explored. These methods include, for example, forming metal caps on copper lines, wherein the metal caps are typically formed of CoWP. These methods generally have tradeoffs, such as increased manufacturing cost. New methods for improving the interconnect structures' resistance to electro-migration are thus needed.

SUMMARY OF THE INVENTION

In accordance with one aspect of the present invention, a method of forming an integrated circuit structure, the method includes providing a semiconductor substrate; forming a dielectric layer over the semiconductor substrate; forming an opening in the dielectric layer; forming a seed layer in the opening; forming a copper line on the seed layer, wherein at least one of the seed layer and the copper line comprises an alloying material; and forming an etch stop layer on the copper line.

In accordance with another aspect of the present invention, a method of forming an integrated circuit structure includes providing a semiconductor substrate; forming a dielectric layer over the semiconductor substrate; forming an opening in the dielectric layer; forming a barrier layer having a portion in the opening; forming a seed layer on the barrier layer, wherein the seed layer comprises an alloying material; filling copper into the opening and on the seed layer; performing a planarization to remove excess copper, excess seed layer, and excess barrier layer, wherein a remaining portion of the copper in the opening forms a copper line; performing a pretreatment to a top surface of the copper line using a process gas selected from the group consisting essentially of $SiH_4$ and $GeH_4$; and forming an etch stop layer on and abutting the copper line.

In accordance with yet another aspect of the present invention, a method of forming an integrated circuit structure includes providing a semiconductor substrate; forming a dielectric layer over the semiconductor substrate; forming an opening in the dielectric layer; forming a barrier layer having a portion in the opening; forming a seed layer on the barrier layer; filling copper into the opening and on the seed layer, wherein at least one of the seed layer and the copper filled in the opening comprises an alloying material; performing a planarization to remove excess copper, excess seed layer, and excess barrier layer, wherein a remaining portion of the copper in the opening forms a copper line; performing a first pretreatment to a top surface of the copper line using $SiH_4$; performing a second pretreatment to the top surface of the copper line using $GeH_4$ after the first pretreatment; and forming an etch stop layer on and abutting the copper line.

In accordance with yet another aspect of the present invention, an integrated circuit structure includes a semiconductor substrate; a dielectric layer over the semiconductor substrate; an opening in the dielectric layer; a copper line filling the opening; a dielectric layer over the copper line; and an interface region between and abutting the copper line and the dielectric layer. The interface region includes an alloy including a non-copper alloying material, and an element selected from a group consisting essentially of silicon, germanium, and combinations thereof.

In accordance with yet another aspect of the present invention, an integrated circuit structure includes a semiconductor substrate; a dielectric layer over the semiconductor substrate; an opening in the dielectric layer; a copper line filling the opening, wherein a non-copper alloying material in the seed layer has a first weight percentage greater than a second percentage of the non-copper alloying material in the copper line; a dielectric layer over the copper line; and an interface region between and abutting the copper line and the dielectric layer. The interface region includes an alloy formed of the non-copper alloying material and an element selected from a group consisting essentially of silicon, germanium, and combinations thereof.

The advantageous feature of the present invention includes improved reliability of interconnect structures against electro-migration without significant cost increase.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Interconnect structures including alloying materials in copper lines and methods of forming the same are provided. The intermediate stages of manufacturing embodiments of the present invention are illustrated. Throughout various views and illustrative embodiments of the present invention, like reference numbers are used to designate like elements.

Figure 1:
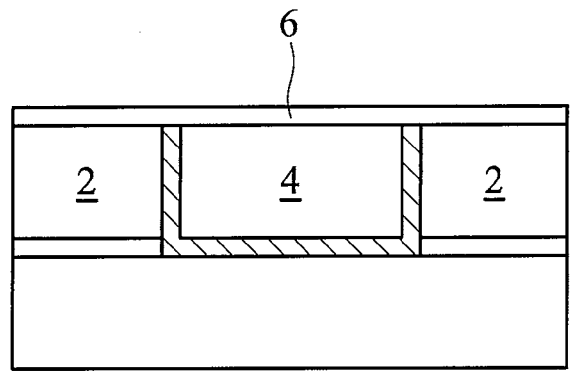
FIG. 1 illustrates a conventional interconnect structure including an etch stop layer on a copper line.
Figure 2:
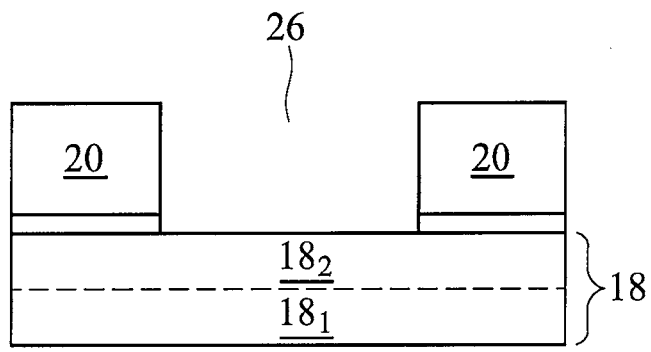
FIGS. 2 through 7 are cross-sectional views of intermediate stages in the manufacturing of an embodiment of the present invention.

FIG. 2 illustrates the formation of opening 26 in dielectric layer 20, which is formed over a schematically illustrated base structure 18. Base structure 18 may include a semiconductor substrate, referred to herein as 18$_1$, and overlying layers 18$_2$ such as a contact etch stop layer (ESL), an inter-layer dielectric (ILD), and inter-metal dielectrics (IMD, not shown). Semiconductor substrate 18$_1$ may be a single crystalline or a compound semiconductor substrate. Active devices (not shown), such as transistors, may be formed on semiconductor substrate 18$_1$. Opening 26 may be a trench for forming a metal line. In an exemplary embodiment, dielectric layer 20 has a low dielectric constant (k value), preferably lower than about 3.5, hence is referred to as low-k dielectric layer 20 throughout the description. More preferably, low-k dielectric layer 20 has a k value of less than about 2.8, and hence is sometimes referred to as an extra low-k (ELK) dielectric layer. Low-k dielectric layer 20 may include commonly used materials such as carbon-containing dielectric materials, and may further contain nitrogen, hydrogen, oxygen, and combinations thereof. A porous structure may exist in low-k dielectric layer 20 for lowering the k value.

Figure 3:
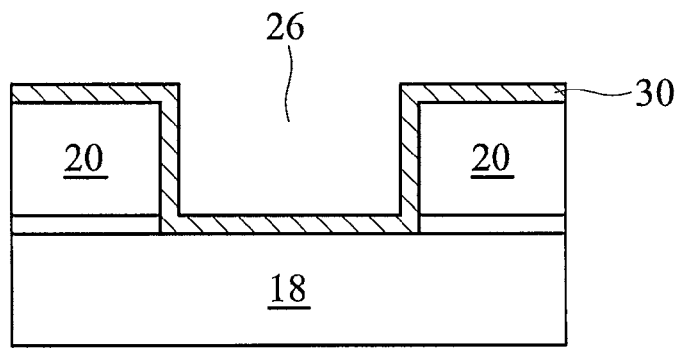

FIG. 3 illustrates the formation of (diffusion) barrier layer 30. Barrier layer 30 preferably includes titanium, titanium nitride, tantalum, tantalum nitride, or other alternatives, and may be formed using physical vapor deposition (PVD) or one of the chemical vapor deposition (CVD) methods. The thickness of barrier layer 30 may be between about 20 Å and about 200 Å. One skilled in the art will realize, however, that the dimensions recited throughout the description are related to the technology used for forming the integrated circuits, and will reduce with the down-scaling of the formation technology.

Figure 4:
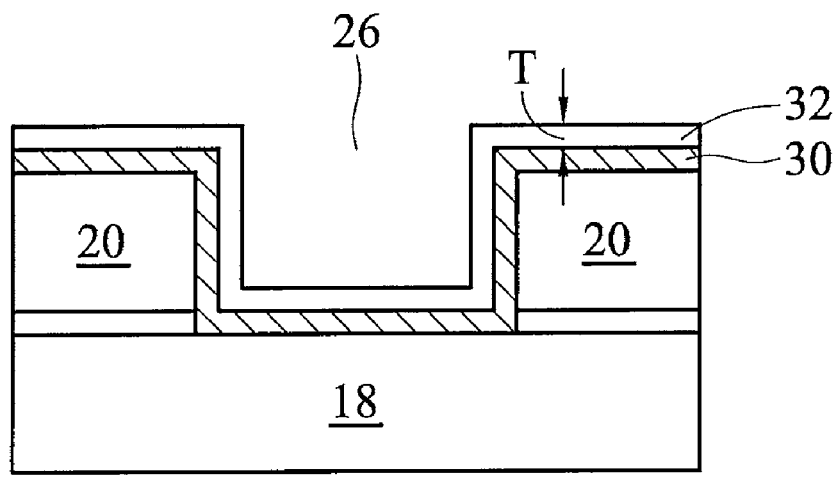

FIG. 4 illustrates the formation of seed layer 32. Seed layer 32 includes a base metallic material alloyed with alloying materials. Preferably, the base material has a percentage of greater than about 90 weight percent in seed layer 32. The base material is preferably copper, although it may also be ruthenium, or other applicable alternatives. The alloying materials are selected based on their soluability with the base material, wherein a great soluability is preferred. Also, it is preferred that the resulting alloy has a low resistivity. Based on these two preferences, the alloying materials in seed layer 32 may be selected from palladium (Pd), gold (Au), silver (Ag), aluminum (Al), niobium (Nb), chromium (Cr), boron (B), titanium (Ti), indium (In), manganese (Mn), and combinations thereof. The alloying materials in seed layer preferably have a percentage of between about 0.1 percent and about 10 weight percent, and more preferably between about 0.25% and about 1%. The thickness T of seed layer 32 is preferably between about 20 Å and about 300 Å, although greater or smaller thicknesses may also be used. It is noted that the increase in the weight percentage of alloying materials in seed layer 32 causes the improvement in the reliability of the resulting interconnect structure. However, excess alloying materials also adversely cause significant increase in the resistivity of the interconnect structure. The determination of the optimal percentage of the alloying material thus needs to take both the reliability and the resistivity into account.

Preferably, seed layer 32 is formed using physical vapor deposition (PVD), which may include DC sputter, RF sputter, bias sputter, magnetron sputter, or the like. The respective target will then include the desirable base material such as copper or ruthenium, and the alloying materials. Alternatively, seed layer 32 may be formed using one of the chemical vapor deposition (CVD) methods, or formed using electroless plating, in which case, the plating solution include both the ions of the base material and the ions of the alloying materials.

Figure 5:
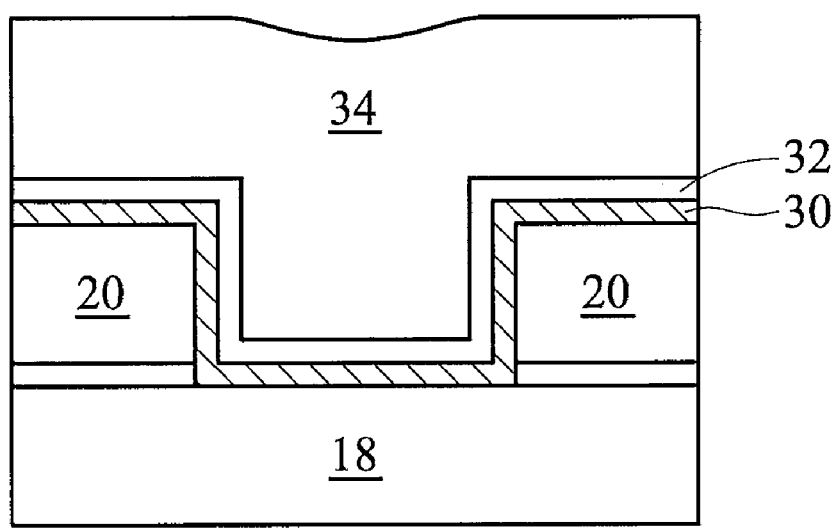

Next, as shown in FIG. 5, copper 34 is filled into the remaining portion of opening 26. In the preferred embodiment, copper 34 is formed using electro plating, wherein the wafer with the structure shown in FIG. 4 is submerged into a plating solution, which contains ionized copper. Although referred to as copper 34, it may also be an alloyed copper including alloying materials. Similarly, the alloying materials preferably have a high soluability with copper, and the resulting copper 34 preferably has a low resistivity. Accordingly, the alloying materials preferably includes Pd, Au, Ag, Al, Nb, Cr, B, Ti, In, Mn, and combinations thereof. The weight percentage of the alloying materials is preferably between about 0.1 percent and about 10 percent, and more preferably between about 0.25 percent and about 1 percent. Experimental results have revealed these ranges of the alloying materials advantageously result in the improvement in the reliability of the resulting interconnect structure without significantly increasing the resistance of the resulting copper line.

Figure 6:
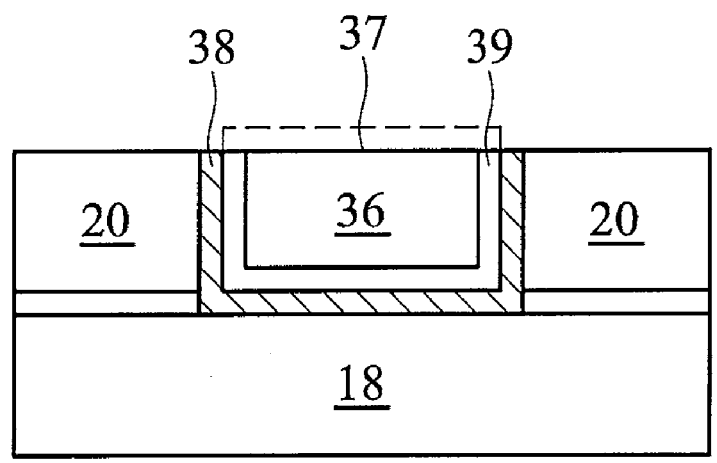

Next, as shown in FIG. 6, a chemical mechanical polish (CMP) is performed to remove excess portions of copper 34, seed layer 32, and barrier layer 30 over low-k dielectric layer 20, leaving copper line 36 and respective underlying portions of seed layer 32 and barrier layer 30 in opening 26. The remaining portions of barrier layer 30 and seed layer 32 are referred to as barrier layer 38 and seed layer 39, respectively. One skilled in the art will realize that if seed layer 39 and copper line 36 are formed of a same material, it is hard to distinguish them. This is particularly true due to the subsequent thermal budget, which causes the inter-diffusion between them. However, if they are doped with different alloying materials and/or with different weight percentages, the weight percentages of the respective alloying materials will still be high at where the alloying materials are doped, even after the diffusion.

In the above-discussed embodiments, both copper line 36 and seed layer 39 includes alloying materials. Alternatively, only one of the copper line 36 and seed layer 39 includes the alloying materials, and the other one includes substantially pure base material (copper/ruthenium).

A pretreatment may then be performed to treat the surface of copper line 36 and seed layer 39. In the preferred embodiment, the pretreatment includes a silicon-containing gas such as $SiH_4$ (silane) or a germanium-containing gas such as $GeH_4$. The pretreatment is preferably thermally performed, with a temperature between about 150° C. and about 350° C. Preferably, no plasma is applied during the thermal pretreatment.

In a first embodiment, the process gases include $SiH_4$ and $NH_3$ (ammonia). In other embodiments, the process gases include $SiH_4$ and a gas selected from $H_2$ (hydrogen), $N_2$ (nitrogen), and combinations thereof. In yet other embodiments, the pretreatment is performed with two steps. In the first step, the process gases include $SiH_4$. Also, $NH_3$ or a combined gas of $H_2$ and $N_2$ may be included. In the second step, the process gases include $GeH_4$. Similarly, $NH_3$, $H_2$, $N_2$, or a combined gas of $H_2$ and $N_2$ may be included. Please note that the first and the second steps are preferably not reversed or performed simultaneously. The reason is that germanium is more active in alloying with the base material. If the second step is performed simultaneously with, or before, the first step, silicon is unlikely to be deposited and alloying with the base material since the base material has already bonded with germanium. In yet other embodiments, the process gases include $GeH_4$. Again, $NH_3$, $H_2$, $N_2$, or a combined gas of $H_2$ and $N_2$ may be included.

Figure 7:
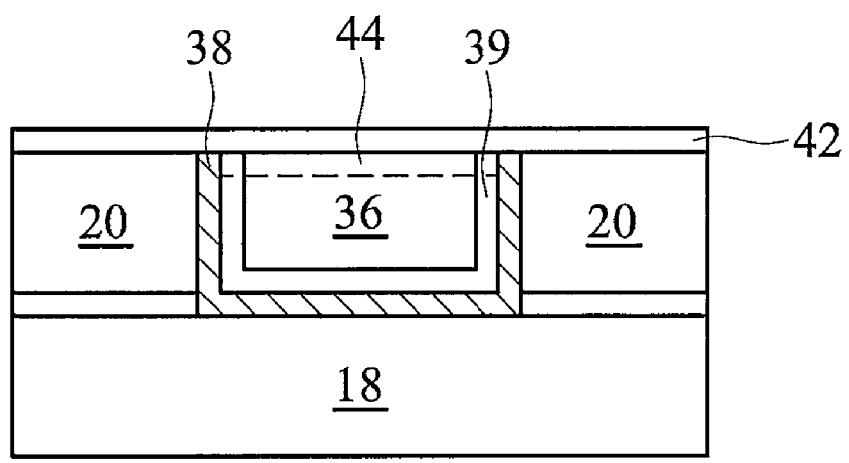

FIG. 7 illustrates the blanket formation of etch stop layer (ESL) 42. ESL 42 is formed of a dielectric material, preferably having a dielectric constant of greater than about 3.5, and may include materials such as silicon nitride, silicon carbide, silicon carbonitride, silicon carbon-oxide, $CH_x$, $CO_yH_x$, and combinations thereof.

During the pretreatment, silicon and/or germanium in the process gases are deposited onto the top surface of, and alloy with, copper line 36 and seed layer 39. The deposited silicon and/or germanium are illustrated as layer 37 in FIG. 6, although the alloying will incur simultaneously as the deposition, and hence a layer of un-alloyed silicon and/or germanium may or may not be seen. In subsequent process steps, a post thermal anneal, which preferably has the temperature of between about 250° C. and about 450° C., is performed to further incur the alloying. The post thermal anneal may come from the subsequent back end of line (BEOL) process steps, such as the formation of overlying low-k dielectric layers. Alternatively, a separate thermal anneal may be added. Due to the thermal budget, the alloying materials in seed layer 39 and/or copper line 36 tend to diffuse to, and trapped in, an interface region 44 (refer to FIG. 7) between copper line 36 (as well as seed layer 39) and overlying ESL 42. The alloy materials are then alloyed with copper and silicon/germanium. Accordingly, interface region 44 includes greater weight percentage of the alloying materials than the neighboring regions in copper line 36. Also, the percentage of the alloying materials in interface region 44 may be greater than in seed layer 32, even if when only the seed layer 32 (but not copper 34 as in FIG. 5) is doped with the alloying materials during the deposition of seed layer 32. Interface region 44 may have a thickness of between about 20 Å and about 30 Å.

Due to the richly concentrated alloying materials in interface region 44, a dual-phase or ternary alloy is formed in interface region 44, wherein the dual-phase or ternary alloy includes the alloying materials and at least one of silicon and germanium. In the case the alloying materials include aluminum, the resulting dual-phase alloy includes AlSi or AlGe, depends on the process gases used in the pretreatment. The ternary alloy includes AlSiGe. In addition, the interface region includes CuSi, CuGe, and/or CuSiGe.

Figure 8:
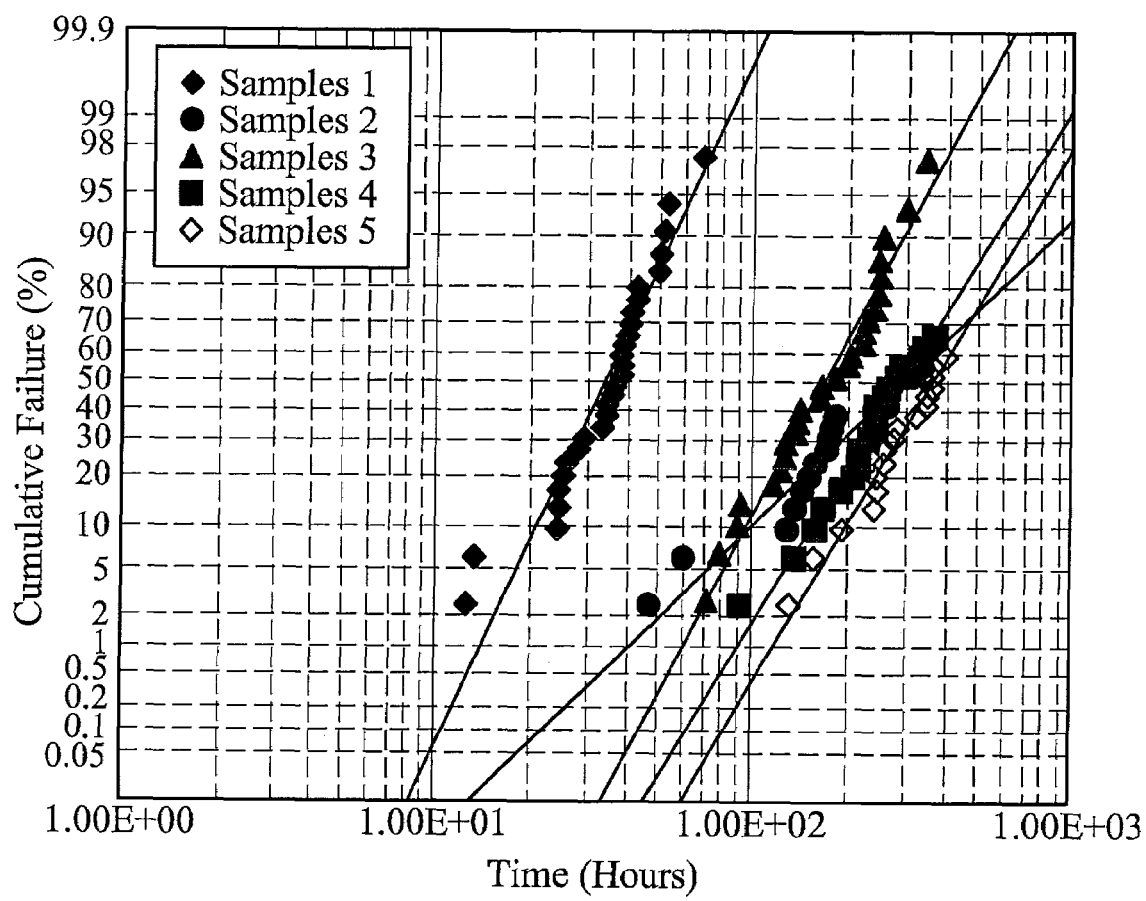
FIG. 8 illustrates experiment results, wherein cumulative failures of the samples are shown as functions of time.

The embodiments of the present invention have improved resistance to electro-migration, which resistance is likely a result of the alloyed interface region 44. FIG. 8 illustrates experiment results comparing several groups of samples formed differently, wherein cumulative failures of the samples are shown as functions of time. Samples 1 include pure copper seed layers, with no pretreatment performed, and the results are shown as solid diamonds. Samples 2 include copper seed layers alloyed with aluminum, with no pretreatment performed. The results of samples 2 are shown as triangles. Samples 3 include copper seed layers alloyed with aluminum, and are pretreated with $SiH_4$ and $NH_3$. The results of samples 3 are shown as circles. Samples 4 include copper seed layers alloyed with aluminum, and are pretreated using $SiH_4$ and hydrogen. The results of samples 4 are shown as squares. Samples 5 include copper seed layers alloyed with aluminum, and are pretreated using $SiH_4$, followed by the treatment using $SiGe_4$. The results of samples 5 are shown as hollow diamonds.

Figure 9:
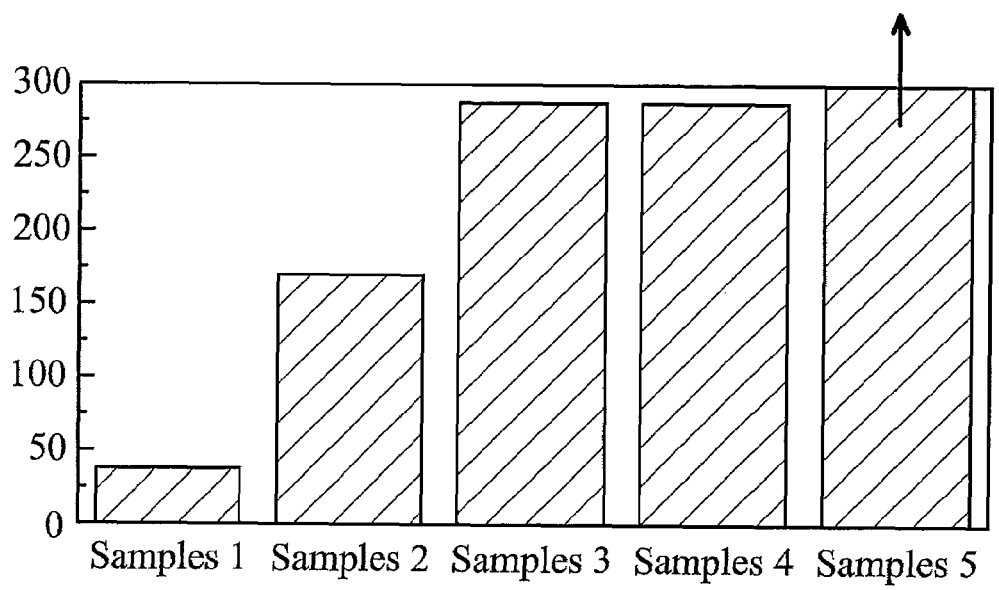
FIG. 9 illustrates the failure times of the samples.

T50 values (the accelerated test time at which 50 percent of samples fail) of the samples are shown in FIG. 9. It is observed that samples 2 (with aluminum doped in seed layer) have a significantly greater T50 value (about 5.6 times) over samples with pure copper in seed layer (samples 1), even if no pretreatment is performed. With pretreatment performed, the T50 values of samples 3, 4, and 5 are further significantly improved over samples 2, resulting in a synergy effect. For example, the T50 value of samples 5 reaches 20 times the T50 values of samples 1. As a comparison, if samples 6 are formed with no alloying materials doped in any of copper 34 and seed layer 32 (refer to FIG. 5), but are pre-treated using $SiH_4$ followed by $SiG_4$, the T50 value of samples 6 is about 3 times of the T50 value of samples 1. Due to the synergy effect, the reliability of the samples with alloying materials and pretreatment in combination (with over 20 times T50 value increase compared to samples 1) is significantly improved over samples with either alloying materials alone with no pretreatment (with about 5.6 times T50 value increase compared to samples 1), or sample with pretreatment but no alloying materials (with about 3 times T50 value increase compared to samples 1).

Further experiment results also show that when the weight percentages of the alloying materials in copper line 36 and/or seed layer 39 are between about 0.25 percent and about 1 percent, the electro-migration resistance is significant without causing significant increase in the respective copper line. However, further increasing the weight percentages of the alloying materials, the resistivity in the copper line increases to unacceptable values. In the results shown in FIGS. 8 and 9, the weight percentages of aluminum seed (if added) are about 0.5 percent.

The embodiments of the present invention have several advantageous features. First, the reliability of the resulting interconnect structure is improved, and the T50 value is increased. Second, compared with bondability between conventional copper and ESL, the bondability between interface region 44 (FIG. 7) and ESL 42 is improved, and hence delamination is less likely to occur. Third, the cost for manufacturing the embodiments of the present invention is low. Although the RC delay of the resulting interconnect structure is slightly increased due to the increase in the resistivity of doped copper lines, the increase is in an acceptable range.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure comprising:
   providing a semiconductor substrate;
   forming a dielectric layer over the semiconductor substrate;
   forming an opening in the dielectric layer;
   forming a seed layer in the opening;
   forming a copper line on the seed layer, wherein at least one of the seed layer and the copper line comprises an alloying material, and wherein the alloying material in the at least one of the seed layer and the copper line has a weight percentage of between about 0.1 percent and about 10 percent; and
   forming an etch stop layer on the copper line.

2. The method of forming the integrated circuit structure according to claim 1 further comprising:
   before the step of forming the etch stop layer, performing a pretreatment on a top surface of the copper line using process gases comprising silicon or germanium.

3. The method of forming the integrated circuit structure according to claim 2, wherein the process gases comprise $SiH_4$ and $NH_3$.

4. The method of forming the integrated circuit structure according to claim 2, wherein the process gases comprise $SiH_4$, and a gas selected from the group consisting essentially of hydrogen, nitrogen, and combinations thereof.

5. The method of forming the integrated circuit structure according to claim 2, wherein the process gases comprise $SiH_4$, and wherein the method further comprises, after the step of the pretreatment using $SiH_4$, performing an additional pretreatment using $GeH_4$.

6. The method of forming the integrated circuit structure according to claim 1, wherein the seed layer is doped with the alloying material during the step of forming the seed layer, and the copper line is not doped with the alloying material during the step of forming the copper line.

7. The method of forming the integrated circuit structure according to claim 1, wherein the copper line is doped with the alloying material during the step of forming the copper line, and the seed layer is not doped with the alloying material during the step of forming the seed layer.

8. The method of forming the integrated circuit structure according to claim 1, wherein the seed layer comprises copper.

9. The method of forming the integrated circuit structure according to claim 1, wherein the weight percentage is between about 0.25 percent and about 1 percent.

10. The method of forming the integrated circuit structure according to claim 1, wherein the alloying material is selected from the group consisting essentially of Pd, Au, Ag, Al, Nb, Cr, B, Ti, In, Mn, and combinations thereof.

11. A method of forming an integrated circuit structure comprising:
    providing a semiconductor substrate;
    forming a dielectric layer over the semiconductor substrate;
    forming an opening in the dielectric layer;
    forming a barrier layer having a portion in the opening;
    forming a seed layer on the barrier layer, wherein the seed layer comprises an alloying material;
    filling copper into the opening and on the seed layer;
    performing a planarization to remove excess copper, excess seed layer, and excess barrier layer, wherein a remaining portion of the copper in the opening forms a copper line;
    performing a pretreatment to a top surface of the copper line using a process gas selected from the group consisting essentially of $SiH_4$ and $GeH_4$; and
    forming an etch stop layer on and abutting the copper line.

12. The method of forming the integrated circuit structure according to claim 11, wherein during the step of filling copper, an additional alloying material is doped into copper.

13. The method of forming the integrated circuit structure according to claim 11, wherein the process gas comprises $SiH_4$, and wherein the method further comprises, after the step of the pretreatment using $SiH_4$, performing an additional pretreatment using $GeH_4$.

14. The method of forming the integrated circuit structure according to of claim 11, wherein at the time the seed layer is formed, a weight percentage of the alloying material in the seed layer is between about 0.25 percent and about 1 percent.

15. The method of forming the integrated circuit structure according to claim 11 further comprising, after the step of forming the etch stop layer, performing a thermal annealing at a temperature of between about 250° C. and about 450° C.

16. The method of forming the integrated circuit structure according to claim 11, wherein the alloying material comprises aluminum.

17. The method of forming the integrated circuit structure according to claim 11, wherein the step of filling copper into the opening is performed with substantially pure copper with substantially no alloy materials doped therein.

18. A method of forming an integrated circuit structure comprising:
    providing a semiconductor substrate;
    forming a dielectric layer over the semiconductor substrate;
    forming an opening in the dielectric layer;
    forming a barrier layer having a portion in the opening;
    forming a seed layer on the barrier layer;
    filling copper into the opening and on the seed layer, wherein at least one of the seed layer and the copper filled in the opening comprises an alloying material;
    performing a planarization to remove excess copper, excess seed layer, and excess barrier layer, wherein a remaining portion of the copper in the opening forms a copper line;
    performing a first pretreatment to a top surface of the copper line using $SiH_4$;
    after the first pretreatment, performing a second pretreatment to the top surface of the copper line using $GeH_4$; and
    forming an etch stop layer on and abutting the copper line.

19. The method of forming the integrated circuit structure according to claim 18, wherein the alloying material comprises palladium.

20. The method of forming the integrated circuit structure according to claim 18, wherein the alloying material comprises aluminum.

21. The method of forming the integrated circuit structure according to claim 18, wherein the first and the second pretreatments are plasma-free.

* * * * *